(12) United States Patent
Freund et al.

(10) Patent No.: US 6,274,458 B1
(45) Date of Patent: Aug. 14, 2001

(54) METHOD OF GAS CLEAVING A SEMICONDUCTOR PRODUCT

(75) Inventors: Joseph Michael Freund, Fogelsville; George John Przybylek, Douglasville; Dennis Mark Romero, Bethlehem, all of PA (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/348,462

(22) Filed: Jul. 7, 1999

(51) Int. Cl.$^7$ ................................................. H01L 21/28
(52) U.S. Cl. ............................ 438/460; 438/68; 438/460
(58) Field of Search ............................ 438/68, 464, 460, 438/458; 225/1, 2, 93, 96, 101

(56) References Cited

U.S. PATENT DOCUMENTS

| | | |
|---|---|---|
| 5,154,333 | 10/1992 | Bauer et al. . |
| 5,171,717 | 12/1992 | Broom et al. . |
| 5,719,077 | 2/1998 | Chakrabarti et al. . |
| 5,968,382 | * 10/1999 | Matsumoto et al. ............ 219/121.72 |
| 6,102,267 | * 8/2000 | Freund et al. ......................... 438/68 |

* cited by examiner

Primary Examiner—David Nelms
Assistant Examiner—Dung A Le
(74) Attorney, Agent, or Firm—Dickstein Shapiro Morin & Oshinsky LLP

(57) ABSTRACT

A device is provided for cleaving semiconductor products or the like. The device may be formed of an inlet for receiving pressurized gas, an adjustable slot for directing the gas toward the products, and a movable flow control member. According to one aspect of the invention, the flow control member is located within a housing that also defines the inlet and the adjustable slot. A cover may be located on the front of the housing. The cover may have a lower edge that forms one side of the slot. The other side of the slot may be formed by the movable flow control member. The cleave device may have an uncomplicated, compact construction. The cleave device may be operated with a flexible product handling system. That is, the brittle products may be handled within opposed flexible sheets. The sheets may be used to locate the products over a ledge (a cleaving position) where they are bent to cause cleaving along crystal planes initiated at scribe or score lines. Uniform bending forces may applied gently and in a non-destructive fashion across the full widths of the semiconductor products. The pressure and cross sectional dimensions of the sheet flow through the adjustable slot may be precisely controlled, if desired. The invention may be used, for example, to increase production yield by reducing the number of integrated circuits formed with defects due to cracking or splitting of silicon material.

10 Claims, 2 Drawing Sheets

METHOD OF GAS CLEAVING A SEMICONDUCTOR PRODUCT

BACKGROUND OF THE INVENTION

The present invention relates to devices for cleaving semiconductor wafers, laser bars, and other products and workpieces. The present invention also relates to methods and systems for cleaving semiconductor devices and other products.

It is known to form laser diodes, photodetectors and other products from semiconductor wafers. During the fabrication of such products, the wafers may be separated or cleaved into laser bars. The resulting bars may be further cleaved into discrete semiconductor chips, if desired. Thus, a known method of forming semiconductor products involves scribing or scoring a semiconductor wafer, followed by cleaving the wafer along the scribed or scored lines.

U.S. Pat. No. 5,171,717 (Broom et al.) describes a method in which a semiconductor wafer is scribed and then placed between two transport bands. The transport bands are guided around a curved surface having a large radius. The surface applies a bending moment to the scribe lines to cleave the wafer. Similarly, U.S. Pat. No. 5,719,077 (Chakrabarti et al.) describes an apparatus that holds a semiconductor workpiece between a fixed jaw and a rotatable jaw. The rotatable jaw rotates to cleave the semiconductor workpiece.

The use of mechanically applied pressure to cleave laser bars and other brittle or fragile products may result in uneven or ragged cleaved edges. In particular, mechanical pressure on the laser bars may cause cracking, splitting, breaking or other damage. If a semiconductor product with an uneven cleaved surface is incorporated into an optical device, such as a laser, an insufficient light output or complete failure of the device may occur.

SUMMARY OF THE INVENTION

The present invention relates to a device for cleaving semiconductor products. The device includes an inlet for receiving pressurized gas, an adjustable slot for directing the gas toward the semiconductor products, and a movable flow control member for directing the gas toward the slot.

According to one aspect of the invention, the flow control member is located within a housing that also defines the inlet and the adjustable slot. A cover may be located on the front of the housing. The cover may have a lower edge that forms one side of the slot. The other side of the slot may be formed by the movable flow control member. Thus, the cleave device of the present invention may have an uncomplicated, compact construction.

The present invention also relates to an apparatus for cleaving brittle products. The apparatus may include a flexible structure for transporting the products to a cleaving position, and a device for flowing pressurized gas onto the flexible structure to bend the products at the cleaving position. The gas flow device may have an adjustable slot formed by a movable flow control member. In a preferred embodiment of the invention, the gas flow device forms a sheet of pressurized gas that may be used to cleave one or more brittle products along preformed scribe or score lines at the cleaving position.

According to another aspect of the invention, the brittle products, which may be wafers or laser bars, are transported within opposed flexible sheets. The sheets may be used to locate the products over a ledge where they are bent to cause cleaving along crystal planes initiated at scribe or score lines.

The present invention also relates to a method of handling semiconductor products. The method may include the following steps: locating the products in a flexible structure; moving the flexible structure to a cleaving position; and flowing pressurized gas through an adjustable slot to bend the flexible structure at the cleaving position. In a preferred embodiment of the invention, the width of the slot is adjusted by moving a flow control member within a housing. The device may be arranged such that adjustment of the slot causes corresponding movement of an integral surface within the housing, such that gas flows smoothly through the housing regardless of the position of the flow control member.

In a preferred embodiment of the invention, pressurized gas is redirected from one or more discrete sources and formed into a uniform sheet. This way, uniform bending forces may applied across the full width or widths of the scribed semiconductor product(s). The pressure and cross sectional dimensions of the gas flow through the slot may be precisely controlled, if desired.

According to a preferred embodiment of the invention, an apparatus is arranged to apply gentle, uniform pressures to cleave laser bars. The invention may be used to increase production yield by reducing the number of integrated circuits formed with defects due to cracking or splitting of the material.

These and other features and advantages will become apparent from the following detailed description of preferred embodiments of the present invention.

DETAILED DESCRIPTION OF PREFERRED EMBODIMENTS

Figure 1:
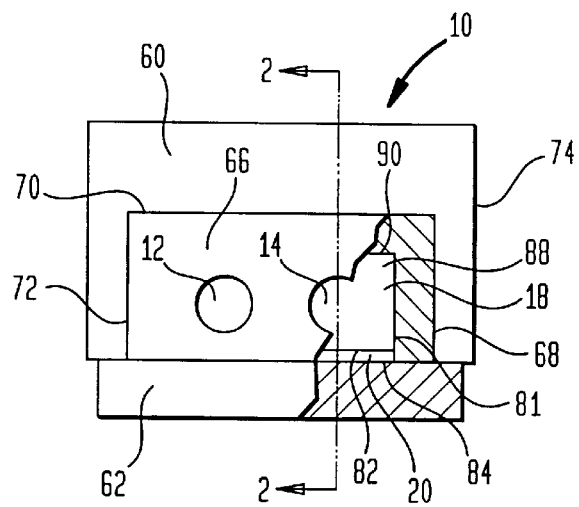
FIG. 1 is a partially broken-away top view of a gas cleave device constructed in accordance with a preferred embodiment of the present invention.
Figure 2:
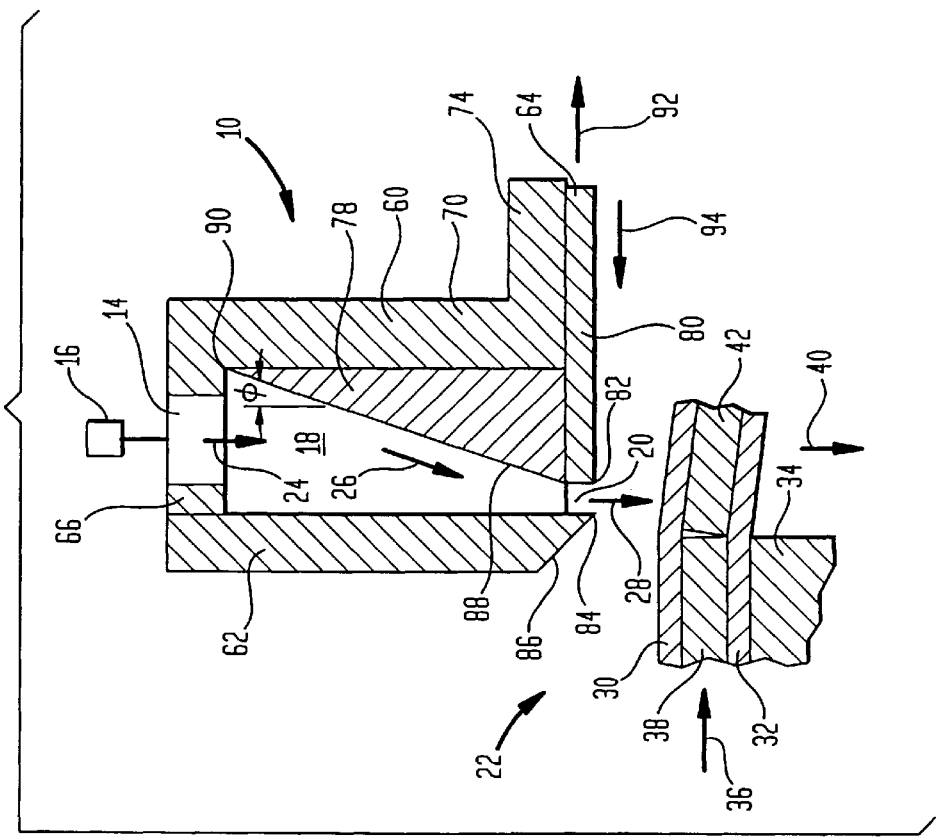
FIG. 2 is a cross sectional view of the device of FIG. 1, taken along the line 2—2, showing the device in combination with a non-contact cleaving apparatus.

Referring now to the drawings, where like numerals designate like elements, there is shown in FIG. 1 a gas cleave device 10 constructed in accordance with a preferred embodiment of the invention. The device 10 has gas inlets 12, 14 for receiving pressurized gas from a suitable source 16 (FIG. 2). In operation, pressurized gas flows through the inlets 12, 14, through a flow chamber 18, through an adjustable slot 20, and toward a non-contact cleaving apparatus 22. The gas flows in the direction of arrows 24, 26, 28.

The cleaving apparatus 22 has a pair of flexible film layers (or sheets) 30, 32 that pass over a compliant ledge 34 (in the direction of arrow 36). A laser bar 38 is supported between and transported by the flexible film layers 30, 32. Pressurized gas flowing through the slot 20, in the direction of arrow 28, forms a sheet of gas that gently biases the flexible structure 30, 32 downwardly in the direction of arrow 40. Thus, the flexible film layers 30, 32 are bent or curved downwardly over the ledge 34, at a cleaving position, which causes a chip 42 to separate from the bar 38 along a preformed scribe or score line. The chip 42 tends to separate from the bar 38 along a crystal plane aligned with the scribe or score line.

If desired, the non-contact cleaving apparatus 22 may be constructed as described in U.S. patent application Ser. No. 09/208,769, filed Dec. 10, 1998, the entire disclosure of which is incorporated herein by reference.

In a preferred embodiment of the invention, the gas cleave device 10 may be formed of a housing member 60, a plenum cover 62, and a flow control member 64. The housing member 60, plenum cover 62 and flow control member 64 may be secured together by screws, bolts, welds or the like. The housing member 60 has a top portion 66 that includes the gas inlets 12, 14. Although two inlets 12, 14 are shown in the drawings, the invention may be employed with more or fewer inlets, if desired. The housing member 60 may also have side walls 68, 70, 72 (FIG. 1) and a base portion 74. The flow chamber 18 may be defined by the housing top portion 66, the side walls 68–72, and the plenum cover 62.

Figure 4:
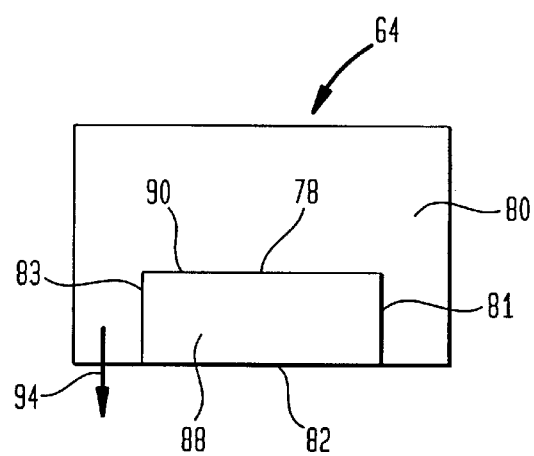
FIG. 4 is a top view of a flow control member for the device of FIG. 1.
Figure 5:
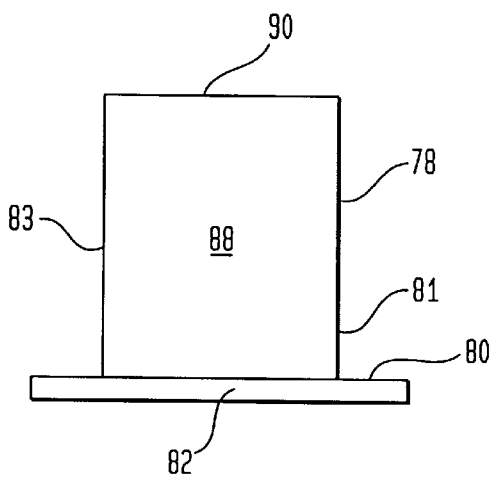
FIG. 5 is a front view of the flow control member of FIG. 4.
Figure 6:
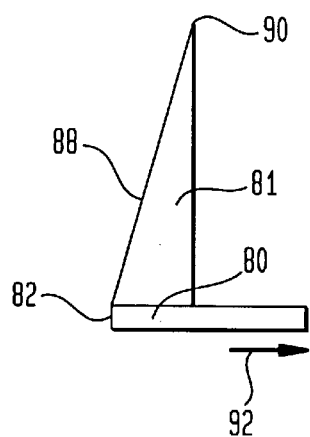
FIG. 6 is a side view of the flow control member of FIG. 4.

The flow control member 64 may be provided with a pyramid shaped flow control wedge 78 (FIG. 2) and a support member 80 (FIGS. 4–6). The flow control wedge 78 may be integrally connected to the support member 80. The flow control wedge 78 is located within the housing (18), as shown in FIG. 2. Thus, the flow control wedge 78 has a bottom edge 82 that cooperates with the bottom edge 84 of the plenum cover 62 to form the width-wise adjustable flow slot 20. In the illustrated embodiment of the invention, the bottom surface 86 of the plenum cover 62 is angled upwardly away from the cleaving apparatus 22 to provide improved access to the slot 20 for maintenance and the like. The present invention should not be limited, however, to the specific construction and instrumentalities shown and described herein.

The flow control wedge 78 may be provided with a flow control surface 88 for guiding pressurized gas toward the slot 20. The vertical angle ø formed by the control surface 88 may be approximately thirty degrees, for example. In operation, pressurized gas flows downwardly through the inlets 12, 14 and is smoothly redirected toward the slot 20 by the flow control surface 88. A sheet of pressurized gas flows downwardly through the slot 20 onto the top film layer 30. In the illustrated embodiment, the control surface 88 extends across the full width of the flow space 18 and is at least as long as the slot 20. The top edge 90 of the control surface 88 may be located between the inlets 12, 14 and the back housing wall 70 so as to not disrupt the flow of pressurized gas through the device 10.

According to a preferred embodiment of the invention, the position of the flow control member 64 may be adjusted in the direction of arrows 92, 94 to adjust the thickness of the slot 20. In the position shown in FIG. 3, the flow control member 64 is located in an adjusted position. In the adjusted position, a relatively narrow slot 20' is formed between the bottom edge 82 of the wedge member 78 and the bottom edge 84 of the plenum cover 62. With the illustrated arrangement, the width of the flow slot 20, 20' may be easily varied. The width may be varied by moving the base portion 80 in response to flow conditions and pressures on the top film 30, for example.

During such adjustment, the base portion 80 of the flow control member 64 may slide against and be stably supported by the base portion 74 of the housing member 60. In addition, the sides 81, 83 (FIG. 4) of the flow control member 64 slide snugly against the housing side walls 68, 72. The planar sliding interfaces between the base portions 80, 74 and the sides 81, 83 and side walls 68, 72 ensure that the lower edge 82 of the flow control member 64 is parallel to the bottom edge 84 of the cover 62. This way, the width of the slot 20, 20' is constant along its entire length for any adjusted position of the flow control member 64.

Figure 3:
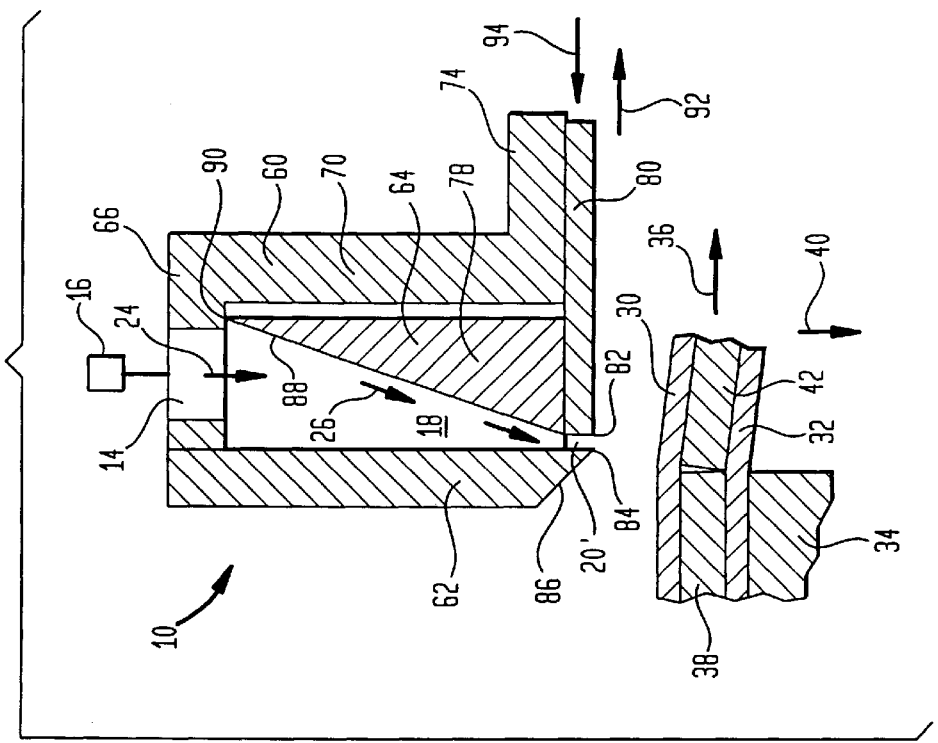
FIG. 3 is a cross sectional view like FIG. 2, showing the gas cleave device in an adjusted position.

The slot 20 has a maximum width in the FIG. 2 position, and an narrower adjusted width in the FIG. 3 position. Thus, the illustrated device 10 may be arranged to provide precise control of gas flow rate and pressure through the slot 20, 20'. By setting or adjusting the location of the flow control member 64, optimum gas flow conditions may be developed for maximum cleave yield in a production process. In a preferred embodiment of the invention, the pressurized gas is directed toward the top film layer 30 at high velocity.

Although the system 10, 22 is described above in connection with a single bar 38 being cleaved into separate chips 42, the invention may also be practiced with a number of wafers or bars or other workpieces handled in series or simultaneously. In particular, a plurality of bars or other brittle products may be transported over the ledge 34 at the same time. A uniform flow of gas may be directed simultaneously onto the plurality of bars or other products via the single slot 20, 20' to perform multiple cleaving operations simultaneously. Although the gas may be supplied by discrete sources 16, 12, 14, the device 10 causes the gas flow to assume a uniform character across the entire length of the slot 20, 20'.

While preferred embodiments have been described above in connection with semiconductor materials, the present invention is also applicable to products and workpieces formed of other materials, especially other brittle and/or crystalline materials. In particular, non-metallic solid materials such as glass, quartz, or ceramic, that fracture or cleave without appreciable prior plastic deformation, may be cleaved in accordance with the present invention.

In the illustrated embodiment, the gas source 16 may be a source of pressurized air. Alternatively, pressurized nitrogen, argon, or carbon dioxide or another suitable gas may be used in the device 10. The gas should preferably be inert so that it does not interact with, or have any adverse effect on, the workpieces 38, 42.

The above description illustrates preferred embodiments of the present invention that achieve certain objects, features and advantages of the present invention. It is not intended that the present invention be limited to the illustrated embodiments. Any modification of the present invention that comes within the spirit and scope of the following claims should be considered part of the present invention.

What is claimed as new and desired to be protected by Letters Patent of the United States is:

1. A method of handling semiconductor products, said method comprising the steps of:
   locating said semiconductor products in a flexible structure;
   moving said flexible structure to a cleaving position;
   flowing pressurized gas through a slot to bend said flexible structure at said cleaving position; and
   adjusting said slot.

2. The method of claim 1, wherein said slot has a width and a length, said width being narrower than said length, and wherein said width extends in the direction of said movement of said flexible structure, and wherein said step of adjusting said slot comprises the step of moving a flow control member in the direction of said movement of said flexible structure.

3. The method of claim 2, wherein said flexible structure comprises opposed flexible sheets, and wherein said semiconductor products are located between said flexible sheets.

4. The method of claim 3, wherein said step of moving said flexible structure causes movement of said semiconductor products over a ledge.

5. The method of claim 4, wherein said pressurized gas comprises air.

6. The method of claim 4, wherein said pressurized gas comprises inert gas.

7. The method of claim 1, further comprising the steps of redirecting said gas from a discrete source and forming a uniform sheet of pressurized gas, and wherein said uniform sheet is directed toward said cleaving position by said slot.

8. The method of claim 1, wherein said adjusting step includes the step of adjusting the width of said slot in the direction of said movement of said flexible structure.

9. The method of claim 4, wherein said products are cleaved along crystal planes and scribe or score lines.

10. The method of claim 4, wherein multiple products are cleaved simultaneously at said cleaving position, and wherein said slot applies uniform gas pressure to said multiple products.

* * * * *